United States Patent
Roedel et al.

[11] Patent Number: 5,888,893
[45] Date of Patent: Mar. 30, 1999

[54] PROCESS FOR ARRANGING PRINTED CONDUCTORS ON THE SURFACE OF A SEMICONDUCTOR COMPONENT

[75] Inventors: Carsten Roedel, Reutlingen; Juergen Scheible, Sonnenbuehl, both of Germany

[73] Assignee: Robert Bosch GmbH, Stuttgart, Germany

[21] Appl. No.: 705,355

[22] Filed: Aug. 29, 1996

[30]     Foreign Application Priority Data

Aug. 29, 1995  [DE]   Germany .................. 195 31 651.7

[51] Int. Cl.⁶ ............................................ H01L 21/441
[52] U.S. Cl. .................... 438/618; 438/666; 438/926; 257/773
[58] Field of Search ................... 438/926, 618, 438/666; 257/773, 775

[56]           References Cited

U.S. PATENT DOCUMENTS 5,228,951  7/1993  Pradel ........................................ 438/533
5,494,853  2/1996  Lur ............................................ 438/631
5,654,221  8/1997  Cronin et al. ............................ 438/109

FOREIGN PATENT DOCUMENTS 0 442 491   8/1991   European Pat. Off. .
55-163859  12/1980   Japan .
1-154531    6/1989   Japan .

OTHER PUBLICATIONS

Ioannis G. Tollis; Wiring In Uniform Grids and Two–Colorable Maps; Integration; 1991; pp. 189–210.

*Primary Examiner*—John F. Niebling
*Assistant Examiner*—Ha Tran Nguyen
*Attorney, Agent, or Firm*—Kenyon & Kenyon

[57]            ABSTRACT

In a process for arranging printed conductors on the surface of a semiconductor component, distances from the first forbidden zones are maintained. This is accomplished by converting the first forbidden zones to second forbidden zones by enlargement, where the zones are enlarged in the x and y directions by a different factor than in the a and b directions. Then paths are produced outside of or at the edge of the second forbidden zones for the arrangement of printed conductors.

10 Claims, 2 Drawing Sheets

PROCESS FOR ARRANGING PRINTED CONDUCTORS ON THE SURFACE OF A SEMICONDUCTOR COMPONENT

BACKGROUND INFORMATION

Methods are already known for arranging semiconductor components by defining paths on which the printed conductors are arranged on the surface of the semiconductor components. The paths are located outside forbidden zones (regions) on the semiconductor surface.

SUMMARY OF THE INVENTION

The process according to the present invention has the advantage that an advantageous arrangement of printed conductors is achieved by a simple method. The printed circuits can be configured in an especially space-saving arrangement through the process according to the present invention. In addition, the printed circuits then maintain optimum distances from the forbidden zones.

In most situations, it is sufficient to define two coordinate systems, each of which has its own enlargement factor. It is especially advantageous if the two coordinate systems form a 45° angle with each other. The process according to the present invention can be carried out especially easily on the basis of grid points, whereby starting from already forbidden grid points, an enlargement is accomplished by taking into account the neighboring grid points. If the forbidden zones are defined as polygons, the individual lines can be enlarged and lengthened.

DETAILED DESCRIPTION

Figure 1:
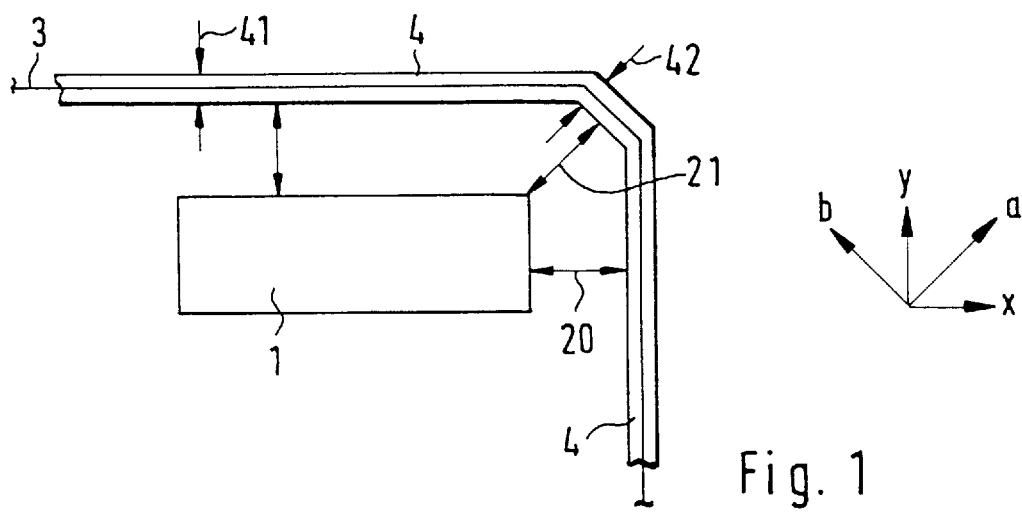
FIG. 1 shows a printed conductor on a semiconductor component.

FIG. 1 shows a printed conductor 4 arranged on a path 3. Path 3 includes a thin continuous line while printed conductor 4 extends with a finite width on both sides of path 3. Forbidden zone 1 denotes an area where no printed conductors may be arranged. This generally involves line segments belonging to other electronic networks, or it may be an area on the semiconductor surface where there is a component whose function could be disturbed by a current flowing through a printed conductor. Printed conductors must also maintain a certain distance from such forbidden zones 1. To minimize the space required for the configuration, it is desirable to have the smallest possible distance between the printed conductor and the forbidden zone.

In the configuration of printed conductors 4 on the surface of semiconductor components, changes in direction of the printed conductors may be necessary. FIG. 1 shows printed conductor 4 which makes a 90° change in direction. However, this change in direction is not accomplished by a single 90° turn but instead by two 45° turns. This is due to the fact that there is a concentration of current on the inside of such bends in lines, i.e., areas where there is an abrupt change in direction of the printed conductor. When there is an abrupt 90° change in direction, the increase in current density is especially great, and premature aging and destruction of printed conductors 4 may occur due to electromigration. This current concentration is reduced by limiting the turns in printed conductors to a maximum of 45° each. In addition, minimum distances from forbidden zones 1 must be maintained in a configuration of printed conductors 4. A first distance 20 must be maintained along straight lines, such as those formed here by the longitudinal sides of rectangular forbidden zone 1. A second distance 21 which is usually greater than the first distance 20 is to be maintained to the corner points of forbidden zones 1. However, distances 20, 21 should not be larger than necessary because that would result in greater space being required for the configuration of printed conductors 4 on the semiconductor surface, which would thus waste semiconductor surface area.

Figure 2:
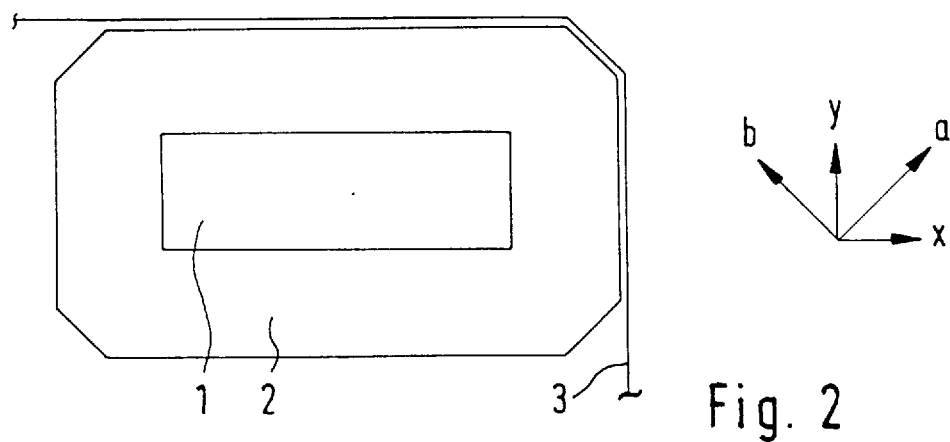
FIG. 2 shows the enlargement of a rectangular forbidden zone.

FIG. 2 shows part of the layout of a semiconductor circuit. Such a layout is a diagram indicating where each semiconductor range and each printed conductor is to be located. To determine where printed conductors may be arranged on the surface of a semiconductor element, a second forbidden zone 2 is created by enlarging the first forbidden zone 1. Then paths 3 for printed conductors can be located outside the second forbidden zone 2. Paths 3 for the printed conductors can also be arranged on the edges of forbidden zones 2.

FIG. 2 illustrates how a suitable enlargement of the first forbidden zone 1 yields a second forbidden zone 2 whose dimensions are designed so the printed conductors maintain an optimum distance 20 from the longitudinal sides and an optimum distance 21 from the corners of forbidden zone 1 while at the same time using only bends with 45° angles. This is achieved by the fact that the second forbidden zone 2, which is formed by enlarging the first forbidden zone 1, is not enlarged uniformly in all directions.

This is accomplished by having a first coordinate system—consisting of the directions x and y—and a second coordinate system—consisting of the directions a and b. The first forbidden zone 1 is enlarged by a first factor in the x and y directions and by a second factor in the a and b directions. The sides of the first rectangular forbidden zone 1 which are parallel to the x and y directions then become the sides of the second forbidden zone 2 which are also parallel to the x and y directions. The corner points of the first forbidden zone 1 then form the sides of the second forbidden zone 2 which are parallel to the a and b directions. In the present case, the x and y directions are perpendicular to each other, the a and b directions are perpendicular to each other, while the x direction forms a 45° angle with the a direction and the y direction forms a 45° angle with the b direction, so the sides of the second forbidden zone 2 which are formed by enlargement of the sides of forbidden zone 1 also form a 45° angle with the sides of the second forbidden zone 2 which are formed by enlargement of the corner points.

With regard to the remaining configuration of the printed conductors, it is also important for the printed conductors to be arranged on paths 3 that are outside or on the edge of the second forbidden zone 2. Since the printed conductors extend on both sides of path 3, as illustrated in FIG. 1, a certain tolerance is calculated into the enlargement of the first forbidden zone 1 to take into account the width of printed conductors 4.

The process described herein is especially suitable if the printed conductors are to be configured automatically by computer. The second forbidden zones 2 already contain all the information regarding the distance between the printed conductors and forbidden zones 1 and at the same time must have only 45° angles, so for further processing it is necessary to take into account the fact that paths 3 for printed conductors 4 must not be located inside forbidden zones 2.

The first forbidden zone 1 can be defined as the interior area enclosed by lines forming a polygon, i.e., the rectangular forbidden zone shown in FIG. 1 consists of four lines connecting the corner points. The second forbidden zone is then created by creating for each of these four lines a new line that is shifted outward in parallel. The displaced lines are also lengthened in the process, so the value of this lengthened line depends on the enlargement factor and on the angle formed with the adjacent line. The resulting lines that have been shifted in parallel are arranged parallel to the x and y directions. The corner points of these lines are then completed by other lines that are parallel to the a and b directions. The second forbidden zone is then defined as the interior of the polygon thus completed.

Furthermore, several grid points may be defined on the semiconductor surface, where they are arranged on straight lines perpendicular to each other. Such grid points are referred to below as grid points arranged perpendicular to each other. A first forbidden zone 1 on such a semiconductor surface would be defined as a quantity of points each of which is assigned the "forbidden" status.

Figure 3:
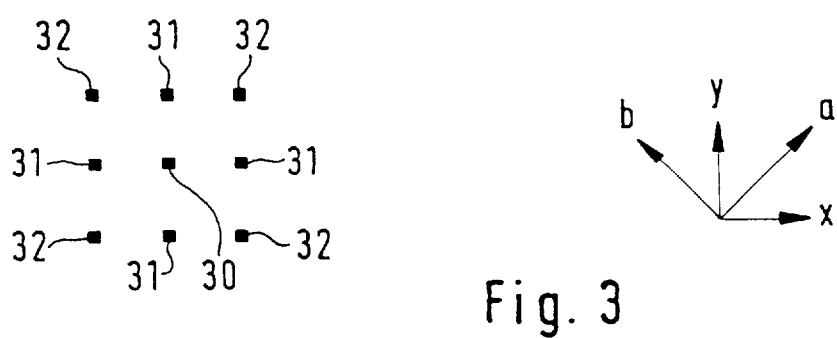
FIG. 3 shows a plurality of grid points on a semiconductor surface.

FIG. 3 shows nine such grid points arranged perpendicular to each other. The central grid point 30 is surrounded by eight neighboring points. The "perpendicular" neighboring points 31 are arranged in the x and y directions around central grid point 30. The diagonal neighboring grid points 32 are arranged in a and b directions. If the distance between central grid point 30 and perpendicular neighboring points 31 is standardized to length 1, the distance between diagonal grid points 32 and central grid point 30 is approximately 1.4 (square root of 2).

Figure 4:
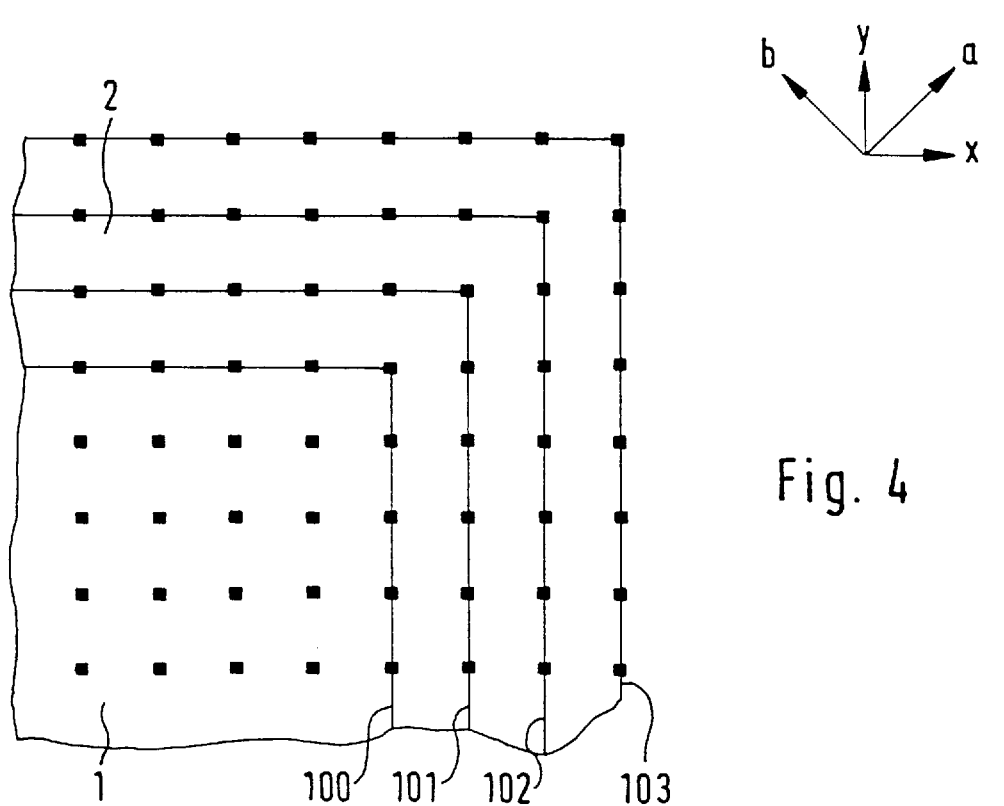
FIG. 4 shows the details of a forbidden zone, illustrating a first method of enlargement.

FIG. 4 shows a detail of a first forbidden zone 1 which is defined as a quantity of grid points that have been assigned the "forbidden" status. To ascertain precisely the outer boundary of this first forbidden zone 1, the outer grid points are indicated with a boundary line 100 connecting the outer grid points. Starting with this first forbidden zone 1, the second forbidden zone 2 is now formed by assigning the "forbidden" status to neighboring grid points that do not yet have this status. Inside the first forbidden zone 1, all the grid points have only neighbors that have also been assigned a "forbidden" status, so enlargement starts with the grid points arranged on outer boundary line 100. Starting from the grid points that have already been assigned a "forbidden" status, this zone is enlarged by assigning the "forbidden" status to all the neighboring grid points, both perpendicular neighboring points 31 and diagonal neighboring points 32. In FIG. 4, the grid points that have been assigned the "forbidden" status in the first enlargement step are connected by line 101. Similarly, the grid points assigned the "forbidden" status in the second and third enlargement steps are connected by lines 102 and 103.

Figure 5:
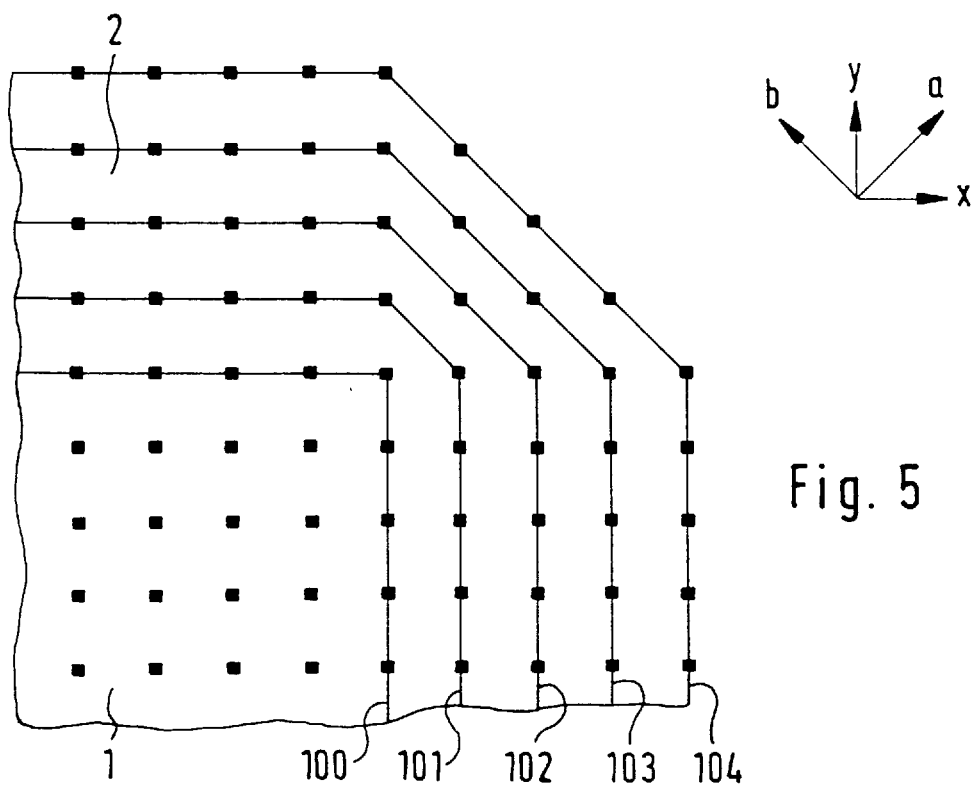
FIG. 5 shows the details of a forbidden zone, illustrating a second method of enlargement.

FIG. 5 also shows a detail of a forbidden zone 1, where the edge points are again indicated by a line 100. Starting with forbidden zone 1, the second forbidden zone 2 is formed by enlarging the first forbidden zone 1. However, the enlargement is accomplished in FIG. 5 by assigning the "forbidden" status only to the perpendicular neighboring points that do not yet have this status. Lines 101 through 104 indicate the grid points assigned the "forbidden" status in the first, second, third and fourth enlargement steps.

If the perpendicular distance between the grid points shown in FIGS. 4 and 5 is again standardized to 1, then the first forbidden zone 1 is enlarged by one unit both in the x and y directions in each enlargement step. In the diagonal, i.e., in the a direction, there is a difference in the two figures due to the great enlargement. In FIG. 4, enlargement in the diagonal is accomplished by a factor of approximately 1.4 units (square root of 2), and in FIG. 5 the diagonal enlargement is accomplished by a factor of approximately 0.7 ((square root of 2) divided by 2) in each enlargement step. The enlargement where only the perpendicular neighboring points are assigned the "forbidden" status, however, results in the creation of a second forbidden zone 2, avoiding the rectangular corners of the second forbidden zone 2.

The enlargement steps described with regard to FIGS. 4 and 5 can also be carried out in alternation or in any sequence relative to each other. Each enlargement step leads to enlargement by one unit of measurement in the x and y directions. Each enlargement step according to FIG. 4 leads to an enlargement by a factor of approximately 1.4 in the a direction, and each enlargement step according to FIG. 5 leads to an enlargement factor of approximately 0.7 in the a direction. The enlargement steps according to FIGS. 4 and 5 can then be performed in any order. If, for example, nine enlargement steps are performed, with three steps carried out according to FIG. 5 and six according to FIG. 4, then the enlargement in the x and y directions will amount to nine units, while the enlargement in the a direction will amount to 3×0.7+6×1.4=10.5 units. The second forbidden zone 2 thus formed has a greater distance in the a and b directions than in the x and y directions. In addition, the outer edge of this second forbidden zone 2 does not have any right angles, but instead has only 45° angles.

The printed conductors are arranged at the center of each path, so printed conductor 4 extends with a finite width on both sides of paths 3. If the printed conductor is again defined by the grid points, then a different value must be provided for the width 41 of printed conductor 4 in the x or y direction than for width 42 of the printed conductor in the a or b direction. Width 41 in the x or y direction may be only an integral multiple of a measurement unit, whereas width 42 in the a or b direction may only be a multiple of 0.7 units ((square root of 2) divided by 2). In enlarging the first forbidden zone 1, these different widths of printed conductor 4 must be taken into account.

What is claimed is:

1. A process for arranging at least one printed conductor on a surface of a semiconductor component, comprising the steps of:

defining at least one first forbidden zone on the surface of the semiconductor component, wherein no printed conductor is arranged in the at least one first forbidden zone;

non-uniformly enlarging the first forbidden zone to form at least one second forbidden zone, wherein no printed conductor is arranged in the at least one second forbidden zone; and arranging the printed conductor on a path lying at least one of outside of the second forbidden zone and on an edge of the second forbidden zone.

2. The process according to claim 1, wherein:

the at least one printed conductor includes a plurality of printed conductors;

the at least one first forbidden zone includes a plurality of first forbidden zones; and the at least one second forbidden zone includes a plurality of second forbidden zones.

3. The process according to claim 1, wherein:

the first forbidden zone is enlarged by a first factor in first and second perpendicular directions; and the first forbidden zone is enlarged by a second factor in third and fourth directions, the third and fourth directions being perpendicular to each other but not perpendicular to the first and second directions.

4. The process according to claim 3, wherein:

the first direction forms a 45° angle with the third direction; and the second direction forms a 45° angle with the fourth direction.

5. The process according to claim 3, wherein the first forbidden zone is enlarged less in the first and second directions than in the third and fourth directions.

6. The process according to claim 1, further comprising the steps of:

defining the first forbidden zone as an interior area of continuous lines that form a polygon;

shifting the lines outward in parallel to enlarge the first forbidden zone; and lengthening the lines using a lengthening factor dependent upon an angle formed with neighboring lines and upon an enlargement factor.

7. The process according to claim 6, further comprising the step of adding additional lines to form a complete polygon.

8. A process for arranging at least one printed conductor on a surface of a semiconductor component, comprising the steps of:

defining at least one first forbidden zone on the surface of the semiconductor component;

non-uniformly enlarging the first forbidden zone to form at least one second forbidden zone; and arranging the printed conductor on a path lying at least one of outside of the second forbidden zone and on an edge of the second forbidden zone, wherein:

the surface of the semiconductor component is covered with a grid of points arranged at right angles to each other, the first forbidden zone is defined by a plurality of grid points that have been assigned a "forbidden" status, the first forbidden zone is enlarged in a sequence of steps in which other grid points, adjacent to forbidden grid points, that have not been assigned the "forbidden" status are also assigned the "forbidden" status, and neighboring grid points are assigned the "forbidden" status in the enlargement step.

9. The process according to claim 8, wherein the neighboring grid points include perpendicular neighboring grid points.

10. The process according to claim 9, wherein the neighboring grid points further include diagonal neighboring grid points.

* * * * *